(12) United States Patent
Chen et al.

(10) Patent No.: US 11,184,117 B2
(45) Date of Patent: Nov. 23, 2021

(54) ENCODING SYSTEM FOR INCREMENTAL REDUNDANCY FOR HYBRID ARQ FOR WIRELESS NETWORKS

(71) Applicant: NOKIA TECHNOLOGIES OY, Espoo (FI)

(72) Inventors: Jie Chen, Schaumburg, IL (US); Jun Tan, Lake Zurich, IL (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 16/346,542

(22) PCT Filed: Nov. 6, 2017

(86) PCT No.: PCT/EP2017/078341
§ 371 (c)(1),
(2) Date: May 1, 2019

(87) PCT Pub. No.: WO2018/083302
PCT Pub. Date: May 11, 2018

(65) Prior Publication Data
US 2019/0268106 A1    Aug. 29, 2019

Related U.S. Application Data

(60) Provisional application No. 62/418,130, filed on Nov. 4, 2016.

(51) Int. Cl.
*H04L 1/18*    (2006.01)
*H03M 13/13*   (2006.01)
*H04L 1/00*    (2006.01)

(52) U.S. Cl.
CPC .......... *H04L 1/1819* (2013.01); *H03M 13/13* (2013.01); *H04L 1/0057* (2013.01); *H04L 1/0065* (2013.01)

(58) Field of Classification Search
None
See application file for complete search history.

(56) References Cited

FOREIGN PATENT DOCUMENTS

| CA | 2972642 A1 * | 9/2015 | ........... H04L 1/1816 |
|----|--------------|--------|------------------------|
| EP | 3113400      | 1/2017 |                        |
| WO | 2015139316 A1| 9/2015 |                        |

OTHER PUBLICATIONS

Chen, "A Hybrid ARQ Scheme Based on Polar Codes", Oct. 2013, IEEE Communications Letters, vol. 17, No. 10 (Year: 2013).*

(Continued)

*Primary Examiner* — April Y Blair
*Assistant Examiner* — Matthew W Wahlin
(74) *Attorney, Agent, or Firm* — Brake Hughes Bellermann LLP

(57) ABSTRACT

Encoding System for Incremental Redundancy for Hybrid ARQ for Wireless Networks A technique is provided for encoding, by an outer encoder, a set of information bits; performing, by each polar sub-encoder of a set of polar sub-encoders, polar encoding of bits received from the outer encoder for a corresponding incremental redundancy (IR) hybrid ARQ (HARQ) transmission; and performing, by an inner encoder, for each bit input to the inner encoder from one of the polar sub-encoders for the HARQ transmission, an Exclusive Or (XOR) operation with another bit, to generate a set of code bits for an IR-HARQ transmission over a channel.

15 Claims, 9 Drawing Sheets

(56) References Cited

OTHER PUBLICATIONS

ZTE, "Discussion on channel coding for new radio interface", Apr. 2016, 3GPP Working Paper (Year: 2016).*
Saber et al.,"An Incremental Redundancy Hybrid ARQ Scheme via Puncturing and Extending of Polar Codes", Nov. 2015, IEEE Transactions on Communications, vol. 63, No. 11. (Year: 2015).*
Li et al, "Capacity-Achieving Rateless Polar Codes", Aug. 13, 2015, ARVIX publication 1508.03112 (Year: 2015).*
International Search Report and Written Opinion for International Application No. PCT/EP2017/078341, dated Feb. 19, 2018 (15 pages).
3GPP TSG RAN WG1 #84bis, R1-162230; "Discussion on Channel Coding for New Radio Interface", Busan, Korea Apr. 11-15, 2016, 12 pages.
3GPP TSG-RAN WG1 #86, R1-166371, "Polar HARQ", Aug. 22-26, 2016, Gothenburg, Sweden, 9 pages.
3GPP TSG-RAN WG1 #86bis, R1-1609586, "Discussion on the IR-HARQ Support of Polar Codes", Lisbon, Portugal, Oct. 10-14, 2016, 3 pages.
3GPP TSG-RAN WG1 Meeting #87, R1-16xxxxx, "Draft Report of 3GPP TAG RAN WG1 #86bisbis v0.1.0 (Lisbon, Portugal, Oct. 10-14, 2016)", Reno, Nevada, USA, Nov. 14-18, 2016, 160 pages.
Tavildar; "A H-ARQ Scheme for Polar Codes"; Jun. 28, 2016; 5 pages.
Saber, et al.; "An Incremental Redundancy Hybrid ARQ Scheme via Puncturing and Extending of Polar Codes"; IEEE Transactions on Communications, vol. 63, No. 11, Nov. 2015; pp. 3964-3973.
Hong, et al.; "Capacity-Achieving Rate-Compatible Polar Codes"; IEEE International Symposium on Information Theory, 2016; pp. 41-45.
Li, et al.; "Capacity-Achieving Rateless Polar Codes"; IEEE International Symposium on Information Theory, 2016; pp. 46-50., pp. 46-50.
Arikan; "Channel Polarization: A Method for Constructing Capacity-Achieving Codes for Symmetric Binary-Input Memoryless Channels"; IEEE Transactions on Information Theory, vol. 55, No. 7, Jul. 2009; pp. 3051-3073.
Tal; "List Decoding of Polar Codes"; IEEE Transactions on Information Theory, vol. 61, No. 5, May 2015; pp. 2213-2226.

\* cited by examiner

Outer encoder     a set of polar sub-encoders     Inner encoder

ENCODING SYSTEM FOR INCREMENTAL REDUNDANCY FOR HYBRID ARQ FOR WIRELESS NETWORKS

CROSS-REFERENCE TO RELATED APPLICATIONS

This application is a national stage entry of International Application No. PCT/EP2017/078341, filed Nov. 6, 2017, entitled "ENCODING SYSTEM FOR INCREMENTAL REDUNDANCY FOR HYBRID ARQ FOR WIRELESS NETWORKS" which claims the benefit of priority of U.S. Provisional Application No. 62/418,130, filed Nov. 4, 2016, both of which are hereby incorporated by reference in their entireties.

TECHNICAL FIELD

This description relates to communications, and in particular, to an encoding system for incremental redundancy (IR) for Hybrid ARQ (HARQ) transmissions/retransmissions for wireless networks.

BACKGROUND

A communication system may be a facility that enables communication between two or more nodes or devices, such as fixed or mobile communication devices. Signals can be carried on wired or wireless carriers.

An example of a cellular communication system is an architecture that is being standardized by the 3$^{rd}$ Generation Partnership Project (3GPP). A recent development in this field is often referred to as the long-term evolution (LTE) of the Universal Mobile Telecommunications System (UMTS) radio-access technology. E-UTRA (evolved UMTS Terrestrial Radio Access) is the air interface of 3GPP's Long Term Evolution (LTE) upgrade path for mobile networks. In LTE, base stations or access points (APs), which are referred to as enhanced Node AP (eNBs), provide wireless access within a coverage area or cell. In LTE, mobile devices, user devices or mobile stations are referred to as user equipments (UEs).

SUMMARY

According to an example implementation, a method is provided for encoding data for incremental redundancy for hybrid ARQ (HARQ) transmissions in a wireless network, the method including: encoding, by an outer encoder, a set of information bits; performing, by each polar sub-encoder of a set of polar sub-encoders, polar encoding of bits received from the outer encoder for a corresponding incremental redundancy (IR) hybrid ARQ (HARQ) transmission; and performing, by an inner encoder, for each bit input to the inner encoder from one of the polar sub-encoders for the HARQ transmission, an Exclusive Or (XOR) operation with another bit, to generate a set of code bits for an IR-HARQ transmission over a channel.

According to an example implementation, an apparatus includes at (east one processor and at least one memory including computer instructions, when executed by the at least one processor, cause the apparatus to perform a method including: encoding, by an outer encoder, a set of information bits; performing, by each polar sub-encoder of a set of polar sub-encoders, polar encoding of bits received from the outer encoder for a corresponding incremental redundancy (IR) hybrid ARQ (HARQ) transmission; and performing, by an inner encoder, for each bit input to the inner encoder from one of the polar sub-encoders for the HARQ transmission, an Exclusive Or (XOR) operation with another bit, to generate a set of code bits for an IR-HARQ transmission over a channel.

According to an example implementation, a computer program product includes a non-transitory computer-readable storage medium and storing executable code that, when executed by at least one data processing apparatus, is configured to cause the at least one data processing apparatus to perform a method including: encoding, by an outer encoder, a set of information bits; performing, by each polar sub-encoder of a set of polar sub-encoders, polar encoding of bits received from the outer encoder for a corresponding incremental redundancy (IR) hybrid ARQ (HARQ) transmission; and performing, by an inner encoder, for each bit input to the inner encoder from one of the polar sub-encoders for the HARQ transmission, an Exclusive Or (XOR) operation with another bit, to generate a set of code bits for an IR-HARQ transmission over a channel.

According to an example implementation, an apparatus is provided to encode data for incremental redundancy for hybrid ARQ (HARQ) transmissions in a wireless network, the apparatus including: an outer encoder to receive and encode a set of information bits; a set of polar sub-encoders, coupled to the outer encoder, configured to increase channel capacity for one or more bit channels via use of polar encoding, a polar sub-encoder of the set of polar sub-encoders provided to perform polar encoding for each corresponding incremental redundancy (IR) hybrid ARQ (HARQ) transmission for a set of information bits; and an inner encoder, coupled to outputs of the set of polar sub-encoders, configured to generate a set of code bits for an IR-HARQ transmission over a channel by performing, for each bit input to the inner encoder from one of the polar sub-encoders for the HARQ transmission, an Exclusive Or (XOR) operation with another bit.

The details of one or more examples of implementations are set forth in the accompanying drawings and the description below. Other features will be apparent from the description and drawings, and from the claims.

DETAILED DESCRIPTION

Figure 1:
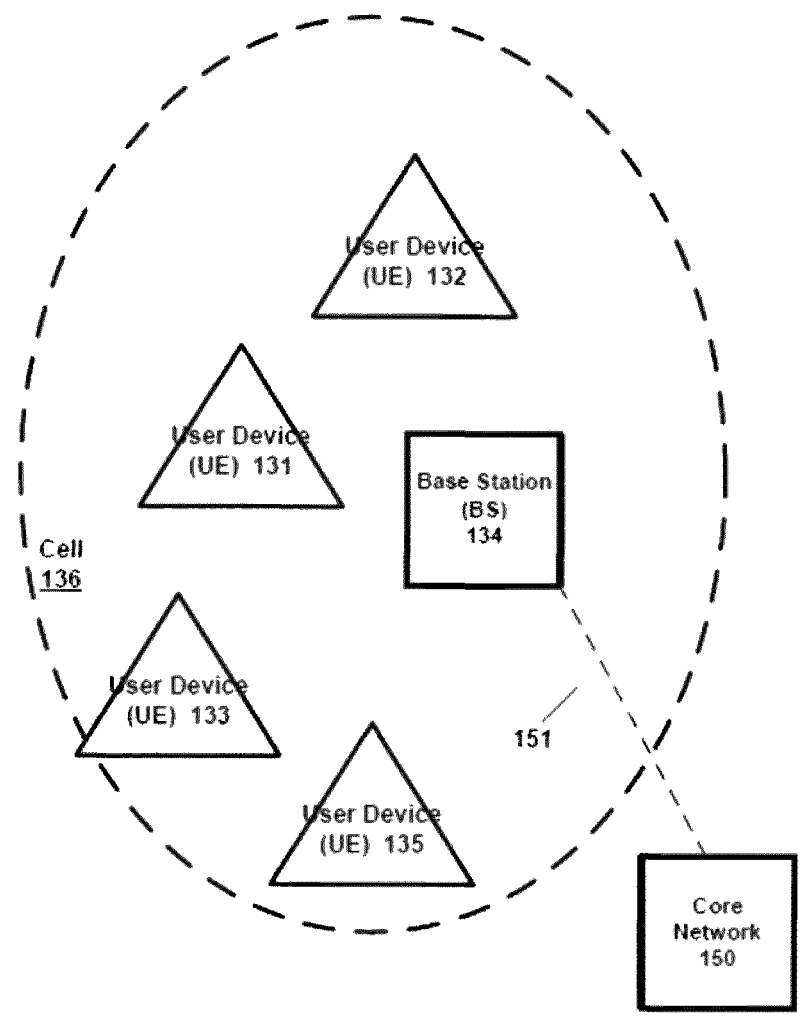
FIG. 1 is a block diagram of a wireless network according to an example implementation.

FIG. 1 is a block diagram of a wireless network 130 according to an example implementation. In the wireless network 130 of FIG. 1, user devices 131, 132, 133 and 135, which may also be referred to as mobile stations (MSs) or user equipment (UEs), may be connected (and in communication) with a base station (BS) 134, which may also be referred to as an access point (AP), an enhanced Node B (eNB) or a network node. At least part of the functionalities of an access point (AP), base station (BS) or (e)Node B (eNB) may also be carried out by any node, server or host which may be operably coupled to a transceiver, such as a remote radio head. BS (or AP) 134 provides wireless coverage within a cell 136, including to user devices 131, 132, 133 and 135. Although only four user devices are shown as being connected or attached to BS 134, any number of user devices may be provided. BS 134 is also connected to a core network 150 via a S1 interface 151. This is merely one simple example of a wireless network, and others may be used.

A user device (user terminal, user equipment (UE) or mobile station) may refer to a portable computing device that includes wireless mobile communication devices operating with or without a subscriber identification module (SIM), including, but not limited to, the following types of devices: a mobile station (MS), a mobile phone, a cell phone, a smartphone, a personal digital assistant (PDA), a handset, a device using a wireless modem (alarm or measurement device, etc.), a laptop and/or touch screen computer, a tablet, a phablet, a game console, a notebook, and a multimedia device, as examples. It should be appreciated that a user device may also be a nearly exclusive uplink only device, of which an example is a camera or video camera loading images or video clips to a network.

By way of illustrative example, the various example implementations or techniques described herein may be applied to various user devices, such as machine type communication (MTC) user devices, enhanced machine type communication (eMTC) user devices, Internet of Things (IoT) user devices, and/or narrowband IoT user devices. IoT may refer to an ever-growing group of objects that may have Internet or network connectivity, so that these objects may send information to and receive information from other network devices. For example, many sensor type applications or devices may monitor a physical condition or a status, and may send a report to a server or other network device, e.g., when an event occurs. Machine Type Communications (MTC, or Machine to Machine communications) may, for example, be characterized by fully automatic data generation, exchange, processing and actuation among intelligent machines, with or without intervention of humans.

Also, in an example implementation, a user device or UE may be a UE/user device with ultra reliable low latency communications (URLLC) applications. A cell (or cells) may include a number of user devices connected to the cell, including user devices of different types or different categories, e.g., including the categories of MTC, NB-IoT, URLLC, or other UE category.

In LTE (as an example), core network 150 may be referred to as Evolved Packet Core (EPC), which may include a mobility management entity (MME) which may handle or assist with mobility/handover of user devices between BSs, one or more gateways that may forward data and control signals between the BSs and packet data networks or the Internet, and other control functions or blocks.

The various example implementations may be applied to a wide variety of wireless technologies or wireless networks, such as LTE, LTE-A, 5G, cmWave, and/or mmWave band networks, IoT, MTC, eMTC, URLLC, etc., or any other wireless network or wireless technology. These example networks or technologies are provided only as illustrative examples, and the various example implementations may be applied to any wireless technology/wireless network.

Polar codes are a new and promising channel coding scheme to approach communication channel capacity, which is a linear block code developed by Erdal Arikan. It is the first channel code with an explicit construction to achieve the capacity of symmetric binary-input, discrete, memoryless channels (BI-DMCs). Polar codes have comparable and sometimes even better performance to state-of-the-art codes like LDPC, meanwhile the decoding complexity of polar codes is as low as O(LN log N). Here N is the encoded block length and L is the list size. These features make polar codes very attractive for many applications, like digital communications and storage.

In order to make channel coding with polar codes practical for wireless communication systems, hybrid automatic repeat request (HARQ) may, for example, be supported to ensure reliable transmission with a limited number of retransmissions. Unlike the well-known incremental redundancy (IR) scheme for turbo codes, the application of IR to polar codes is not straightforward due to polar codes' construction. Therefore, various implementations and details are described for a new polar code incremental redundancy scheme, e.g., for hybrid automatic repeat request (HARQ) transmissions (initial transmissions and retransmissions) are described.

Figure 1A:
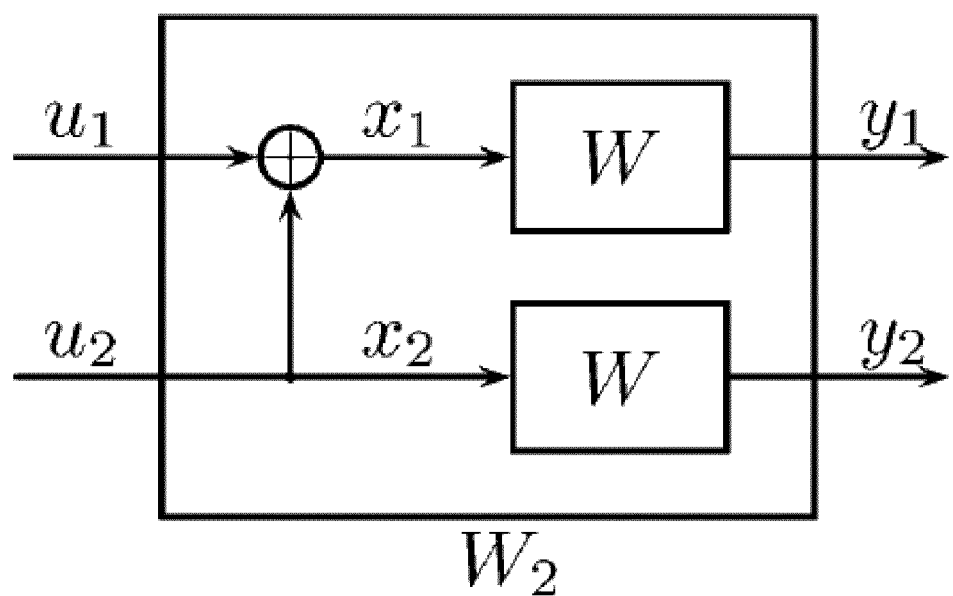
FIG. 1a is a basic building block of polar codes.

Polar codes are based on the concept of polarization. The basic building block in polar codes can be depicted in FIG. 1a.

Here refer to the input bits of the encoder, and $y_i$ refer to the output/encoded bits of the encoder. It can be shown that in this configuration, the mutual information $I(U_1; Y_1, Y_2)$ decreases compared to the pre-polarized pair, $I(U_1; Y_1)$, while $I(U_2; Y_1, Y_2, U_1)$ increases compared to $I(U_2; Y_2)$. In this way, one channel is degraded and the other one is upgraded. This phenomenon is called channel polarization [1]. As shown in FIG. 1, u1 and u2 are information bits, where an XOR (exclusive OR or modulo-2 addition operation) is performed on information bits u1 and u2 to produce code bit x1, and u2 is passed through (without any XOR operation) to produce code bit x2. Code bits x1 and x2 are transmitted over channel W to provide received code bits (or encoded bits) y1 and y2, respectively. Two bit channels are shown in the two-bit polar encoder of FIG. 2, including a bit channel for bit u1, and a bit channel for bit u2. The channel capacity for bit channel for u2 is increased or enhanced, while the channel capacity for the u1 bit channel is decreased. Bit channel for bit u1 is decreased due to u2 interfering based on a XOR or modulo-2 addition of u1 and u2 to produce x1. No interference occurs (or XOR operation occurs) for x2, and thus, u2 channel capacity is increased, resulting in a corresponding decrease in channel capacity for u1/x1 channel. This process may be repeated, to cause some channels to increase in capacity, and other channel to decrease in capacity, which causes polarization. For example, polar codes may be used to enhance channel capacity of one or more bit channels, while similarly decreasing channel capacities of one or more other bits channels. Data may then be transmitted over the enhanced channels (having increased channel capacities), and fixed values or frozen bits, e.g., zeros, may be transmitted over the decreased channels.

By systematically replicating and stacking the basic blocks, longer polar codes can be constructed. For example, the following characterizes a length-4 polar code. R4 refers to a reverse shuffle of the inputs or permutation, e.g., with 4 inputs, 4 outputs. Two of the 2-bit polar encoders (basic building block for polar encoder) shown in FIG. 1 are included within this 4 bit polar encoder of FIG. 2.

Figure 2:
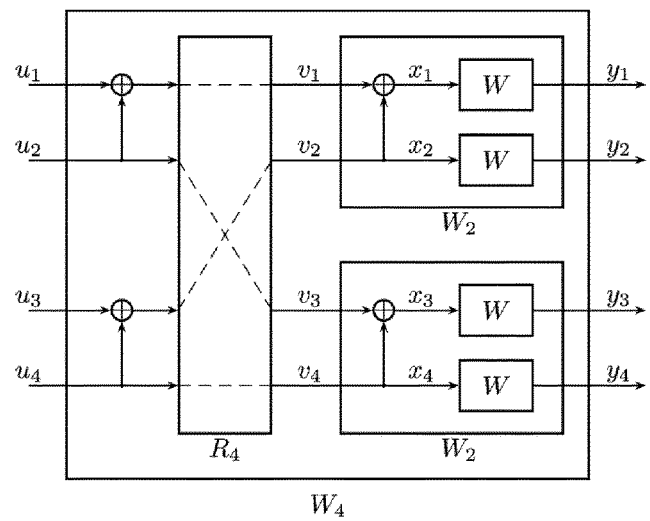
FIG. 2 is an encoding graph of length-4 polar codes.

As shown in FIG. 2, the channel capacity for input bit u4 is enhanced twice based on absence of XOR operations between u4 and y4, resulting in a twice-enhanced channel at output bit y4. Similarly, channel for input bit u1 is decreased twice, e.g., based on first XOR operation with u2, and then v1 XOR with x2, to cause output bit y1 to be twice decreased in channel capacity. Channels for u2 and u3 are in-between (being increased and decreased channel capacity).

As the number of layers grows up, the channels are kept being degraded and upgraded. In other words, the polarization effect becomes more and more visible. Eventually, some channels would have zero capacity and the others would become error-free. The idea of polar codes is to choose the error-free channels to transmit information bits and force the value of the bits transmitted in the zero-capacity channels to be some known value, e.g., 0. These bits are called frozen bits.

By choosing the K best channels out of the total N polarized channels, a rate K/N polar code can be obtained. In the example shown in FIG. 2, K=2 may be selected with ($u_3$, $u_4$) as information bits, and ($u_1$, $u_2$) as frozen bits. Effectively a polar code of rate 1/2 is constructed, in this manner, as an example.

When HARQ (hybrid ARQ) is applied with polar codes, a retransmission scheme is needed to ensure good performance with low complexity. HARQ is a technique that combines high rate error-correcting coding and ARQ error-control. When the receiver detects a corrupted message, it requests a retransmission, which will be used to do a combined decoding with the original message to ensure reliable transmission.

In general, there are two main soft combining methods for HARQ:
1. Chase combining (CC), where every retransmission contains identical information (information bits and parity check bits); and
2. Incremental redundancy (IR), where every retransmission is different.

Usually, the IR scheme is superior compared to Chase combining. Chase combining is essential a repetition coding, which does not provide further coding gain, while good IR schemes provide more coded information to ensure additional coding gain.

The design of IR-HARQ requires a family of compatible codes, where member codes of the family are used for the first transmission and successive retransmissions (e.g., different redundancy versions of a block or set of data to be transmitted or retransmitted). Compatibility here can have different meanings for different codes. For turbo codes, it means that the consecutive transmitted bits in the first transmission and retransmissions are all from the 1/3 rate mother code. For LDPC, it could mean that the bits of retransmissions can be combined with the initial transmission to form a larger LDPC codeword. For polar codes, it could simply mean that the successive retransmissions could be used for decoding the firstly (or initially) transmitted bits. Overall, in an example implementation, it may be desirable that a larger coding gain could be achieved compared to Chase combining, at least for some cases.

An example of IR-HARQ scheme is the LTE's punctured turbo code with circular buffer. With the help of retransmissions, different versions of redundancy are provided to improve the decoding performance of the original rate-1/3 mother code, as an illustrative example. However, this puncturing-based scheme usually does not work with polar codes or other linear block codes.

According to an example implementation, an encoding system may be provided to encode data for incremental redundancy for hybrid ARQ (HARQ) transmissions in a wireless network, the apparatus including: an outer encoder to receive and encode a set of information bits; a set of polar sub-encoders, coupled to the outer encoder, configured to increase channel capacity for one or more bit channels via use of polar encoding, a polar sub-encoder of the set of polar sub-encoders provided to perform polar encoding for each corresponding incremental redundancy (IR) hybrid ARQ (HARQ) transmission for a set of information bits; and an inner encoder, coupled to outputs of the set of polar sub-encoders, configured to generate a set of code bits for an IR-HARQ transmission over a channel by performing, for each bit input to the inner encoder from one of the polar sub-encoders for the HARQ transmission, an Exclusive Or (XOR) operation with another bit.

Thus, a multi-phase encoder may include an outer encoder, a set of polar sub-encoders, and an inner encoder. The multi-phase encoder thus may include:
General "Inner" coding designs, which further encode previous transmitted bits for retransmissions under the new general inner and outer coding design paradigm for IR-HARQ schemes; and
Detailed "inner" coding design, including exclusive OR operations among retransmissions, with combination of "Outer" coding design, including schemes to facilitate encoding of retransmitting information bits; and
Redundancy combining schemes, including joint list decoding over multiple retransmissions.

Figure 3:
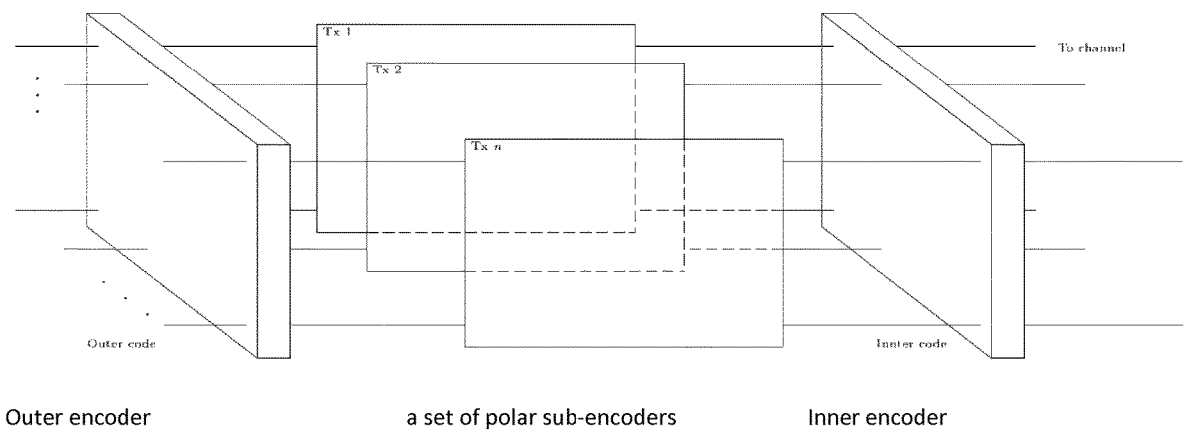
FIG. 3 is an inner and outer code model for IR-HARQ.

To facilitate the discussion of the retransmission schemes for IR-HARQ, a view of inner and outer coding to model HARQ retransmission schemes is illustrated in FIG. 3.

Information bits are fed into the outer encoder, which encodes or distributes information bits for multiple transmissions with a maximum Tx number of n. Each transmission can be corresponding to an independent code, such as a polar code in our context. Theoretically, the codes depicted in the Tx frames could be any error-correction code in general. For example, it could be turbo codes, LDPC codes, convolution codes, etc. The Tx1 code is the code for the $1^{st}$ transmission. When retransmission is needed, Tx2, Tx3, . . . , Tx-n will be applied as requested. In the most general case, even the coding schemes for different transmissions can be different; however, we assume an identical coding scheme applied to all transmissions in this report, which is polar code.

The "inner code", or inner encoder, in the model, in general, shall further encode coded bits of different IR-HARQ transmissions. For the $1^{st}$ transmission, the coded bits for Tx1 code will be directly transmitted. For other transmissions, the transmitted bits will be a function of the encoded bits in the current Tx together with previously encoded bits. This process is similar to an "inner encoder" from a general channel coding point of view. According to an example implementation, simple outer and inner codes for IR-HARQ may be used. With these simple codes, it may be shown that good polar code IR-HARQ performance can be achieved, and the performance, for example, may not be worse than that of Chase combining for any block sizes and coding rates, at least in some cases, according to an example implementation.

With the inner and outer code model for IR-HARQ, rate matching and puncturing can be easily implemented with a large degree of flexibility. For example, if a target code is (n, k) with n coded bits and the sub-code for one transmission is (N, k), if N<n≤2N, we can use two Tx sub-codes and the second sub-coded bits will be punctured to match the coded bits n. Various puncturing patterns can be supported under this design paradigm.

According to an example implementation, polar encoding may be used for the sub-encoders. However, other types of encoding may alternatively be used as a set of sub-encoders, such as: turbo coding, block coding or other error correction codes.

Inner Code: An Example Design

As an example, we provide a simple design for the inner code under the inner/outer code model for IR-HARQ. To illustrate the idea, we use very short polar codes in FIG. 2.

Figure 4:
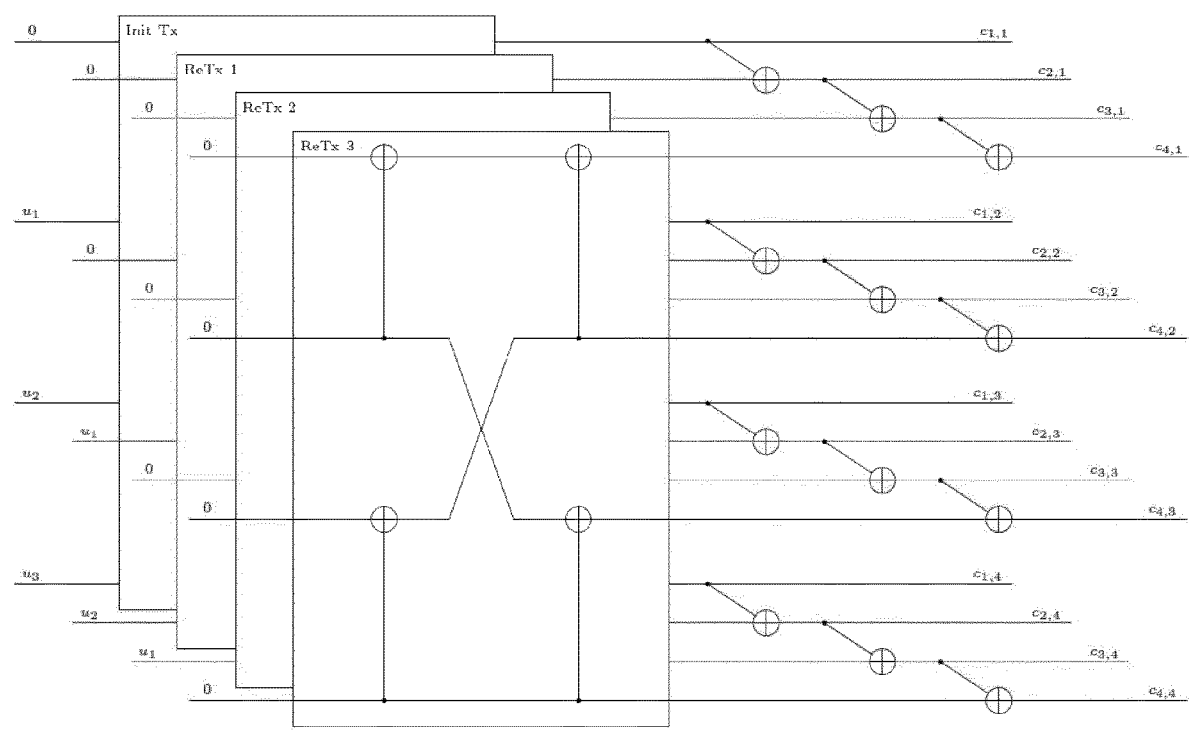
FIG. 4 is an example polar code IR-HARQ scheme.

In FIG. 4, an inner encoder is configured to generate a set of code bits for an IR-HARQ transmission over a channel by performing, for each bit input to the inner encoder from one of the polar sub-encoders for the HARQ transmission, an Exclusive Or (XOR) operation with a corresponding bit output by a different polar sub-encoder of the set of polar encoders. Zeros applied as inputs to the outer encoder are the frozen bits, e.g., applied to the decreased channels. These zeros (frozen bits) are applied as input to the polar sub-encoders. At the outer encoder: there is one frozen bit applied to the polar sub-encoder for initial transmission (Init Tx); there are two frozen bits applied to polar sub-encoder for the second transmission (ReTx1); there are three frozen bits applied to polar sub-encoder for the third transmission (ReTx2); there are four frozen bits applied to polar sub-encoder for the fourth transmission (ReTx3); etc.

As shown in FIG. 4, the initial transmission sends polar coded bits. When retransmission is needed, the output of the $2^{nd}$ Tx coded bits will be XORed (exclusive OR operation) with the coded bits of the $1^{st}$ transmission. For the $3^{rd}$ Tx, its coded bits will be XORed with the coded bits of the $2^{nd}$ transmission, and so on.

For example, as shown in FIG. 4, as part of the inner encoder, c1 refers to the (vector of) output bits output by the polar sub-encoder for the initial (or first transmission); c2 refers to the vector of output bits output by the polar sub-encoder for the second transmission (or first retransmission); etc. Bit 1 output from $2^{nd}$ transmission (ReTx1), shown as c2,1 is generated as an XOR of bit c2, 1 with bit 1 of the first transmission/initial transmission (Init Tx), shown as c1, 1. Bit c4, 1 (bit 1 of retransmission 3, which is the fourth transmission of the set of data), is generated as an XOR of bit c4, 1 with bit 1 from polar encoder for retransmission 2 (or third transmission), c3, 1. In this manner, according to this illustrative example, each bit output by a polar encoder is XORed with a corresponding bit of a previous transmission/or previously used polar encoder.

Figure 5:
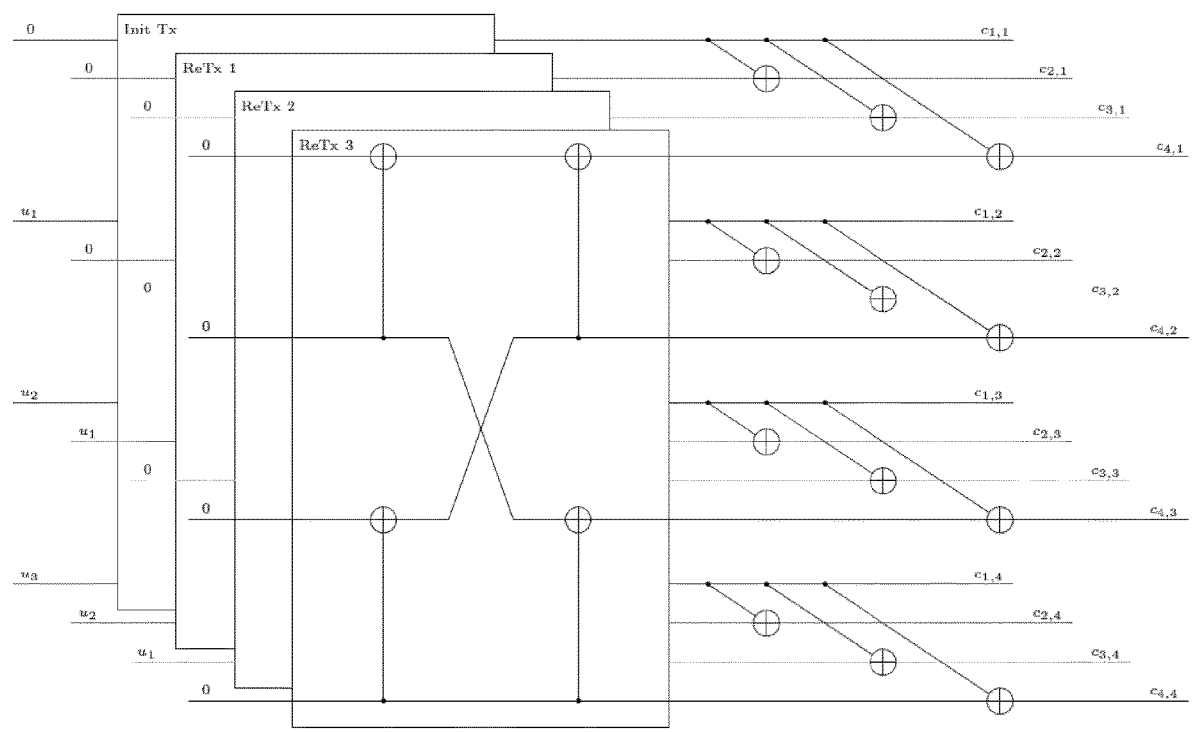
FIG. 5 is an alternative "inner code" (or inner encoder) design for the polar code IR-HARQ scheme.

An alternative design of the "inner code" is shown in FIG. 5. For the inner encoder of FIG. 5, the inner encoder is configured to generate a set of code bits for an IR-HARQ transmission over a channel by performing, for each bit input to the inner encoder from one of the polar sub-encoders for the HARQ transmission, an Exclusive Or (XOR) operation with a corresponding bit output by a plurality of different polar sub-encoders of the set of polar encoders, each different polar sub-encoders associated with a different IR-HARQ transmission.

The difference here in FIG. 5, as compared to FIG. 4, is that the $3^{rd}$ Tx coded bits are the results of XOR operations between the $1^{st}$ Tx code and $3^{rd}$ Tx code, and the $4^{th}$ Tx coded bits are also XORed with the $1^{st}$ Tx coded bits. This scheme enables the direct redundancy improvement for the initial (the $1^{st}$) transmission.

Let $u_i$ denote the information bit vector of the ith transmission, $c_i$ be the coded bit vector of the ith transmission, and $G_i$ be the generator matrix of the corresponding polar sub-encoder.

For the design in FIG. 4, we have $u_1=[0\ u_1\ u_2\ u_3]$, $u_2=[0\ 0\ u_1\ u_2]$, $u_3=[0\ 0\ 0\ u_1]$, $u_4=[0\ 0\ 0\ 0]$, $c_1=[c_{1,1}\ c_{1,2}\ c_{1,3}\ c_{1,4}]$, $c_2=[c_{2,1}\ c_{2,2}\ c_{2,3}\ c_{2,4}]$, $c_3=[c_{3,1}\ c_{3,2}\ c_{3,3}\ c_{3,4}]$, and $c_4=[c_{4,1}\ c_{4,2}\ c_{4,3}\ c_{4,4}]$, and the coded bits of all transmissions can be stacked as $$[c_1\ c_2\ c_3\ c_4] = [u_1\ u_2\ u_3\ u_4] \begin{bmatrix} G_1 & G_1 & G_1 & G_1 \\ 0 & G_2 & G_2 & G_2 \\ 0 & 0 & G_3 & G_3 \\ 0 & 0 & 0 & G_4 \end{bmatrix},$$

where the addition operation is the modulo-2 addition.

Similarly, for the alternative design in FIG. 5, the coded bits can be stacked as $$[c_1\ c_2\ c_3\ c_4] = [u_1\ u_2\ u_3\ u_4] \begin{bmatrix} G_1 & G_1 & G_1 & G_1 \\ 0 & G_2 & 0 & 0 \\ 0 & 0 & G_3 & 0 \\ 0 & 0 & 0 & G_4 \end{bmatrix}.$$

In general, the relationship between the information bits and coded bits can be characterized as $$[c_1\ \ldots\ c_n]=[u_1\ \ldots\ u_n]G,$$

and if a different G is selected, it will lead to a different IR-HARQ design. For example, a G different from FIGS. 4 and 5 could be $$\begin{bmatrix} G_1 & G_1 & 0 & 0 \\ 0 & G_2 & G_2 & 0 \\ 0 & 0 & G_3 & G_3 \\ 0 & 0 & 0 & G_4 \end{bmatrix}.$$

In fact, for four transmissions, all inner code designs can be characterized by $$G = \begin{bmatrix} G_1 & G_1\ \text{or}\ 0 & G_1\ \text{or}\ 0 & G_1\ \text{or}\ 0 \\ 0 & G_2 & G_2\ \text{or}\ 0 & G_2\ \text{or}\ 0 \\ 0 & 0 & G_3 & G_3\ \text{or}\ 0 \\ 0 & 0 & 0 & G_4 \end{bmatrix}.$$

According to an example implementation, there are 64 possible choices for G in total, and each of them corresponds to one inner code design. Some of the inner code designs will lead to very good IR-HARQ decoding performance, while some of them will not. Although, only two illustrative examples are shown in FIGS. 4 and 5 for the inner encoder, there may be 64 variations of the inner encoder, e.g., for 4 bits. For the most general case, i.e., the number of total transmission is an arbitrary n, all inner code designs can be characterized by $$G = \begin{bmatrix} G_1 & G_1 \text{ or } 0 & G_1 \text{ or } 0 & G_1 \text{ or } 0 \\ 0 & G_2 & G_2 \text{ or } 0 & G_2 \text{ or } 0 \\ \ldots & \ldots & \ldots & \ldots \\ 0 & 0 & 0 & G_n \end{bmatrix}.$$

The total number of choices for G is $2^{(n-1)n/2}$.

Figure 6:
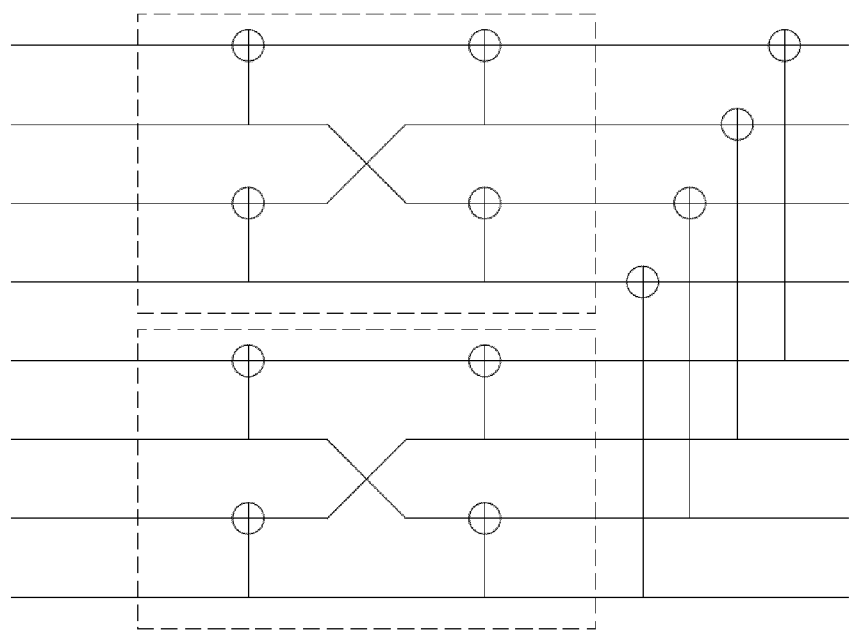
FIG. 6 is a "flattened" graph with two exemplary sub-codes for polar IR-HARQ.

A "flattened" graph with two exemplary subcodes is shown in FIG. 6, which is equivalent to the one Tx and one ReTx case for the model in FIG. 4. An interesting observation is that the overall retransmission structure can be considered as a general polar code. This potentially enables direct application of polar decoding scheme for redundancy combining and decoding for IR-HARQ.

In one embodiment, sub-polar codes used in each transmission can be separately optimized. Further designs are open for possible performance improvement. With this design, arbitrary block lengths and rates of the sub-polar codes can be realized by using conventional techniques like puncturing.

Outer Code (Outer Encoder): An Example Design

A very simple outer code design exists. Assuming that $k \geq k_1 \geq k_2 \geq k_3$:

For the first transmission, transmit information bit $x_1, x_2, \ldots, x_k$, and $x_1, x_2, \ldots, x_{k1}$ are at the less polarized bit channels;

For the second transmission, transmit information bit $x_1, x_2, \ldots, x_{k1}$, and in this transmission bit $x_1, x_2, \ldots, x_{k2}$ are at the less polarized bit channels;

For the third transmission, transmit information bit $x_1, x_2, \ldots, x_{k2}$, and in this transmission bit $x_1, x_2, \ldots, x_{k3}$, are at the less polarized bit channels.

For the last transmission, transmit information bit $x_1, x_2, \ldots, x_{k3}$.

According to an example implementation, these techniques are used in a simulation, and simulation results show that even with this very simple method the IR-HARQ performance is good.

Decoding and Redundancy Combining Decoding and combining of retransmissions is straightfoward. For each transmition the coded bits can be decoded separately. The decoding and redundancy combining can follow this procedure:

1. Decode the n-th tx data and make hard decisions;
2. Update the input LLRs of the n−1 th tx data with the help of the hard decisions of the n-th tx;
3. Use the n-th decoded data as frozen bits to decode the n−1 th tx data;
4. Repeat step 1, 2 and 3 for each transmission, until the first transmission is decoded. The decoded bits of the $1^{st}$ transmission are the output of decoding.

Other redundancy combining and decoding schemes are possible. For example, an alternative decoding process can utilize joint list decoding, following this procedure:

1. List-decode the n-th tx data and keep the hard and soft outputs in all lists;
2. Continue the list-decoding for the n−1 th tx data by using the hard and soft outputs of the previous transmission. Still keep the resulted n−1 th tx hard and soft outputs in all lists. Repeat the same procedure for all remaining transmissions;
3. Make a hard decision for each information bit only when the first transmission is decoded.

The advantages of the proposed scheme may include one or more of the following, by way of example:

The design may provide that the IR-HARQ performance will typically not be worse than Chase combining.

The inner and outer codes can be separately designed to further improve performance.

It can support any rates and code block sizes in each transmission with proper inner and outer code designs.

The reason that the described IR-HARQ scheme has good performance is that if the decoding of the current transmission succeeds then it can help or assist in the decoding of previous transmissions due to the existence of outer coding, meanwhile the successful decoding would also provide additional information at the inner coding side, which would further enhance the overall decoding performance. The simplest case is that for all retransmissions no information bits are transmitted, which is effectively a repetition coding scheme and the performance is exactly the same as that of Chase combining. Any non-trivial outer coding will further improve the overall performance. Therefore, this scheme is superior to Chase combining.

Figure 6A:
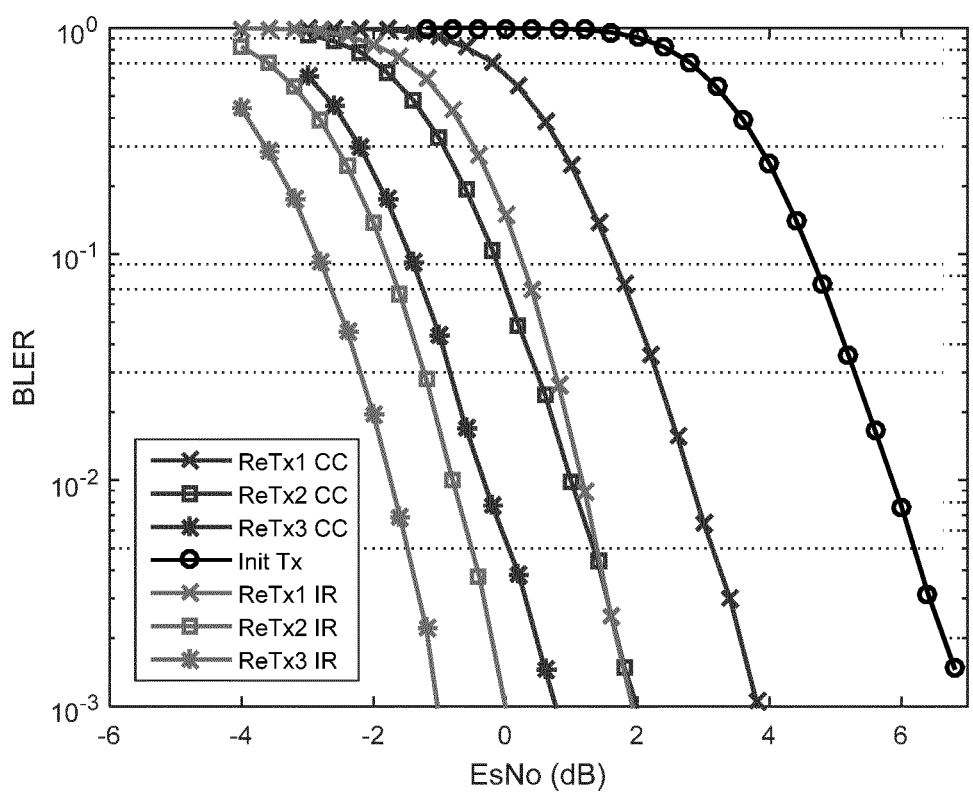
FIG. 6a is a BLER comparison of CC and IR, (K=96, N=128).

FIG. 6a compares the block error rate (BLER) performance of CC and the proposed IR schemes for the (N=128, K=96) case. The code rate is 3/4 as a high coding rate case. A non-CRC-aided list decoder is used for decoding, and the list size is 32. The IR scheme always outperforms CC. The gain is about 2 dB against CC for each retransmission, as illustrated in FIG. 6a.

Figure 8:
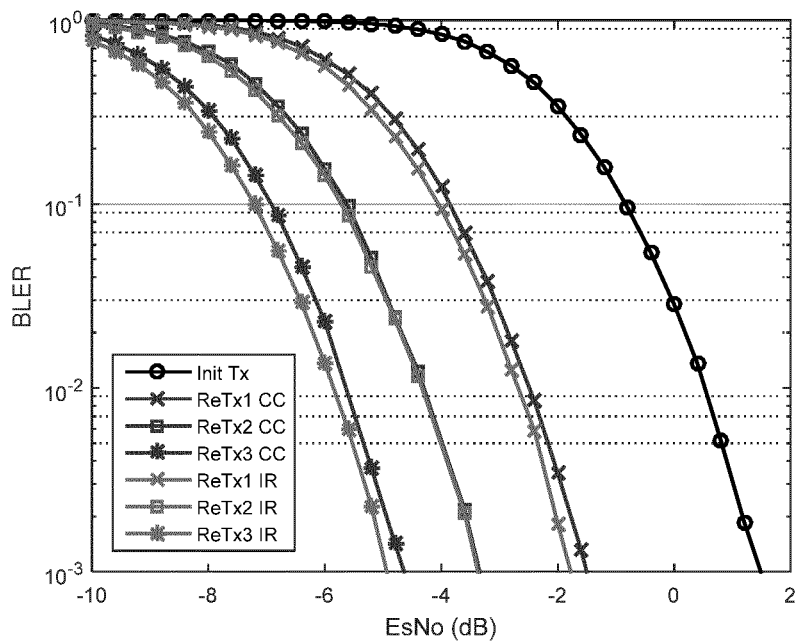
FIG. 8 is a BLER comparison of CC and IR, (K=40, N=128).
Figure 9:
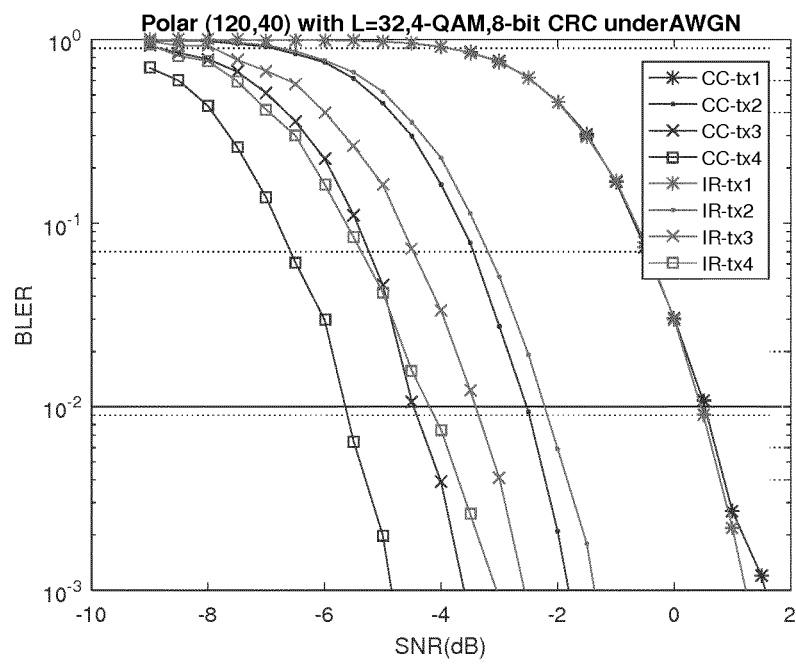
FIG. 9 is a BLER comparison of CC and IR in [6], (K=40, N=120).

The performance of a low coding rate (rate 1/3) is also shown in FIG. 8, together with the results of another technique shown in FIG. 9. FIG. 8 compares the block error rate (BLER) performance of CC and the proposed IR schemes. The number of information bits, K, is equal to 40, and the number of coded bits, N, is 128. The code rate is approximately 1/3. It is clear that the IR scheme may typically outperform CC (Chase Combining).

LIST OF ABBREVIATIONS

Figure 7:
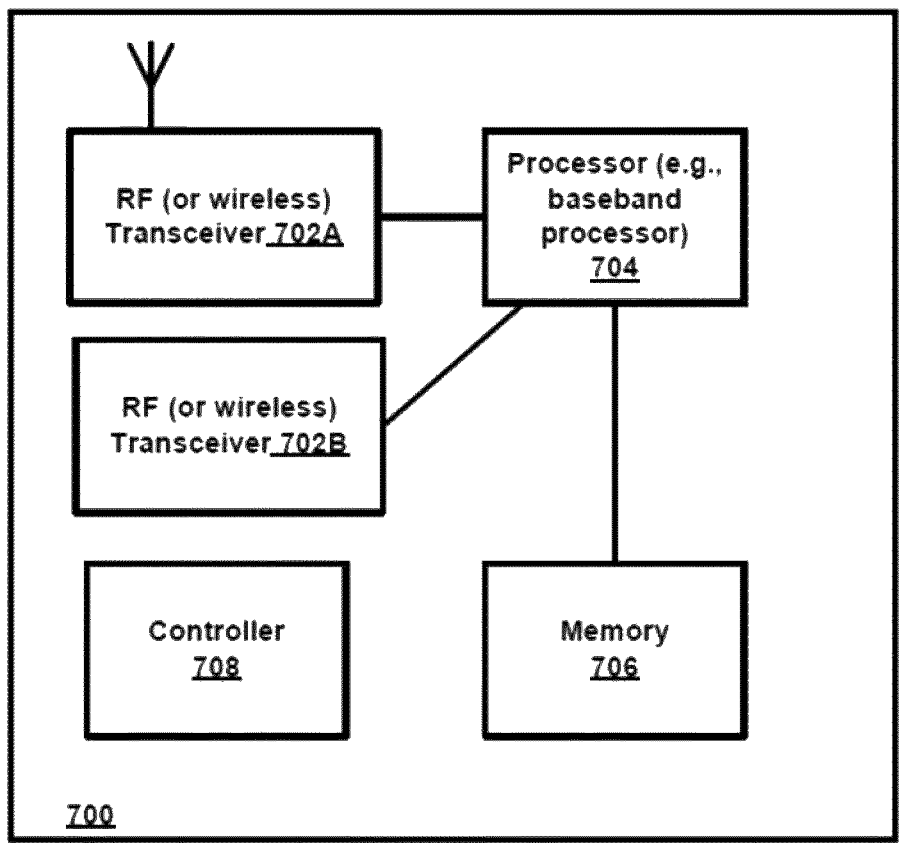
FIG. 7 is a block diagram of a wireless station.

3GPP: 3rd Generation Partnership Project
BI-DMC: symmetric binary-input, discrete, memoryless channel
CC: Chase combining
GF: Galois field
HARQ: hybrid automatic repeat request
IR: incremental redundancy
LDPC: low-density parity-check
NR: new radio
ReTx: retransmission
Tx: transmission FIG. 7 is a block diagram of a wireless station (e.g., AP, BS, eNB (macro or micro), UE or user device) 700 according to an example implementation. The wireless station 700 may include, for example, one or two RF (radio frequency) or wireless transceivers 702A, 702B, where each wireless transceiver includes a transmitter to transmit signals and a receiver to receive signals. The wireless station also includes a processor or control unit/entity (controller) 704 to execute instructions or software and control transmission and receptions of signals, and a memory 706 to store data and/or instructions.

Processor 704 may also make decisions or determinations, generate frames, packets or messages for transmission, decode received frames or messages for further processing, and other tasks or functions described herein. Processor 704, which may be a baseband processor, for example, may generate messages, packets, frames or other signals for transmission via wireless transceiver 702 (702A or 702B). Processor 704 may control transmission of signals or messages over a wireless network, and may control the reception of signals or messages, etc., via a wireless network (e.g., after being down-converted by wireless transceiver 702, for example). Processor 704 may be programmable and capable of executing software or other instructions stored in memory or on other computer media to perform the various tasks and functions described above, such as one or more of the tasks or methods described above. Processor 704 may be (or may include), for example, hardware, programmable logic, a programmable processor that executes software or firmware, and/or any combination of these. Using other terminology, processor 704 and transceiver 702 together may be considered as a wireless transmitter/receiver system, for example.

In addition, referring to FIG. 7, a controller (or processor) 708 may execute software and instructions, and may provide overall control for the station 700, and may provide control for other systems not shown in FIG. 7, such as controlling input/output devices (e.g., display, keypad), and/or may execute software for one or more applications that may be provided on wireless station 700, such as, for example, an email program, audio/video applications, a word processor, a Voice over IP application, or other application or software.

In addition, a storage medium may be provided that includes stored instructions, which when executed by a controller or processor may result in the processor 704, or other controller or processor, performing one or more of the functions or tasks described above.

According to another example implementation, RF or wireless transceiver(s) 702A/702B may receive signals or data and/or transmit or send signals or data. Processor 704 (and possibly transceivers 702A/702B) may control the RF or wireless transceiver 702A or 702B to receive, send, broadcast or transmit signals or data.

The embodiments are not, however, restricted to the system that is given as an example, but a person skilled in the art may apply the solution to other communication systems. Another example of a suitable communications system is the 5G concept. It is assumed that network architecture in 5G will be quite similar to that of the LTE-advanced. 5G is likely to use multiple input-multiple output (MIMO) antennas, many more base stations or nodes than the LTE (a so-called small cell concept), including macro sites operating in co-operation with smaller stations and perhaps also employing a variety of radio technologies for better coverage and enhanced data rates.

It should be appreciated that future networks will most probably utilise network functions virtualization (NFV) which is a network architecture concept that proposes virtualizing network node functions into "building blocks" or entities that may be operationally connected or linked together to provide services. A virtualized network function (VNF) may comprise one or more virtual machines running computer program codes using standard or general type servers instead of customized hardware. Cloud computing or data storage may also be utilized. In radio communications this may mean node operations may be carried out, at least partly, in a server, host or node operationally coupled to a remote radio head. It is also possible that node operations will be distributed among a plurality of servers, nodes or hosts. It should also be understood that the distribution of labour between core network operations and base station operations may differ from that of the LTE or even be non-existent.

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device or in a propagated signal, for execution by, or to control the operation of, a data processing apparatus, e.g., a programmable processor, a computer, or multiple computers. Implementations may also be provided on a computer readable medium or computer readable storage medium, which may be a non-transitory medium. Implementations of the various techniques may also include implementations provided via transitory signals or media, and/or programs and/or software implementations that are downloadable via the Internet or other network(s), either wired networks and/or wireless networks. In addition, implementations may be provided via machine type communications (MTC), and also via an Internet of Things (IOT).

The computer program may be in source code form, object code form, or in some intermediate form, and it may be stored in some sort of carrier, distribution medium, or computer readable medium, which may be any entity or device capable of carrying the program. Such carriers include a record medium, computer memory, read-only memory, photoelectrical and/or electrical carrier signal, telecommunications signal, and software distribution package, for example. Depending on the processing power needed, the computer program may be executed in a single electronic digital computer or it may be distributed amongst a number of computers.

Furthermore, implementations of the various techniques described herein may use a cyber-physical system (CPS) (a system of collaborating computational elements controlling physical entities). CPS may enable the implementation and exploitation of massive amounts of interconnected ICT devices (sensors, actuators, processors microcontrollers, . . . ) embedded in physical objects at different locations. Mobile cyber physical systems, in which the physical system in question has inherent mobility, are a subcategory of cyber-physical systems. Examples of mobile physical systems include mobile robotics and electronics transported by humans or animals. The rise in popularity of smartphones has increased interest in the area of mobile cyber-physical systems. Therefore, various implementations of techniques described herein may be provided via one or more of these technologies.

A computer program, such as the computer program(s) described above, can be written in any form of programming language, including compiled or interpreted languages, and can be deployed in any form, including as a stand-alone program or as a module, component, subroutine, or other unit or part of it suitable for use in a computing environment. A computer program can be deployed to be executed on one computer or on multiple computers at one site or distributed across multiple sites and interconnected by a communication network.

Method steps may be performed by one or more programmable processors executing a computer program or computer program portions to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer, chip or chipset. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

The processor and the memory may be supplemented by, or incorporated in, special purpose logic circuitry.

To provide for interaction with a user, implementations may be implemented on a computer having a display device, e.g., a cathode ray tube (CRT) or liquid crystal display (LCD) monitor, for displaying information to the user and a user interface, such as a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. An apparatus to encode data for incremental redundancy for hybrid ARQ (HARQ) transmissions in a wireless network, the apparatus comprising:
    an outer encoder to receive and encode a set of information bits;
    a set of polar sub-encoders, coupled to the outer encoder, configured to increase channel capacity for one or more bit channels via use of polar encoding, a polar sub-encoder of the set of polar sub-encoders provided to perform polar encoding for each corresponding incremental redundancy (IR) hybrid ARQ (HARQ) transmission for a set of information bits; and
    an inner encoder, coupled to outputs of the set of polar sub-encoders, configured to:
        generate a set of code bits for an IR-HARQ transmission over a channel by performing, for each bit input to the inner encoder from one of the polar sub-encoders for the IR-HARQ transmission, an Exclusive Or (XOR) operation with another bit, where the code bits are outputted by a plurality of polar sub-encoders of the set of polar sub-encoders, and each of the polar sub-encoders is associated with an IR-HARQ transmission, an IR-HARQ retransmission, a plurality of IR-HARQ transmissions, or a plurality of IR-HARQ retransmissions;
        apply at least one frozen bit to the set of polar sub-encoders for an initial transmission of the IR-HARQ transmission;
        apply at least two frozen bits to the set of polar sub-encoders for a first retransmission of the IR-HARQ transmission; and
        apply at least three frozen bits to the set of polar sub-encoders for a second retransmission of the IR-HARQ transmission.

2. The apparatus of claim 1 wherein the outer encoder comprises a repeat encoder that repeats a set of information bits for each of the IR-HARQ transmissions, including for an initial transmission and one or more retransmissions.

3. The apparatus of claim 1 wherein the outer encoder is configured to select a linear combination of received information bits for input to one or more of the polar sub-encoders.

4. The apparatus of claim 1 wherein the set of polar sub-encoders comprises a polar sub-encoder, coupled to the outer encoder and the inner encoder, for each of a plurality of IR-HARQ transmissions, including for an initial transmission and one or more retransmissions, each polar sub-encoder including one or more two-bit polar encoder building blocks.

5. The apparatus of claim 1 wherein the inner encoder is configured to generate a set of code bits for an IR-HARQ transmission over a channel by performing, for each bit input to the inner encoder from one of the polar sub-encoders for the IR-HARQ transmission, an Exclusive Or (XOR) operation with a corresponding bit output by a different polar sub-encoder of the set of polar encoders.

6. The apparatus of claim 1 wherein the inner encoder is configured to generate a set of code bits for an IR-HARQ transmission over a channel by performing, for each bit input to the inner encoder from one of the polar sub-encoders for the HARQ transmission, an Exclusive Or (XOR) operation with a corresponding bit output by a plurality of different polar sub-encoders of the set of polar encoders, each of the plurality of different polar sub-encoders being associated with a different IR-HARQ transmission.

7. The apparatus of claim 1 wherein the inner encoder is configured to generate a set of code bits for an IR-HARQ transmission over a channel by performing, for each bit input to the inner encoder from one of the polar sub-encoders for the IR-HARQ transmission, an Exclusive Or (XOR) operation with a corresponding bit output by a (immediately or adjacent in time) previous polar sub-encoder of the set of polar encoders, the previous polar sub-encoder used to perform encoding of the immediately previous IR-HARQ transmission.

8. The apparatus of claim 1 wherein the inner encoder is further configured to:
    perform an XOR operation between code bits of a first retransmission and an initial transmission; and
    perform an XOR operation between code bits of a second retransmission and the first retransmission.

9. The apparatus of claim 1, wherein the inner encoder, coupled to outputs of the set of polar sub-encoders, is further configured to:
    apply, by the inner encoder, a first set of one or more frozen bits to the set of polar sub-encoders for an initial transmission of the IR-HARQ transmission;

apply, by the inner encoder, a second set of one or more frozen bits to the set of polar sub-encoders for a first retransmission of the IR-HARQ transmission; and apply, by the inner encoder, a third set of one or more frozen bits to the set of polar sub-encoders for a second retransmission of the IR-HARQ transmission.

10. The apparatus of claim 1, wherein the inner encoder is configured to generate a set of code bits for an IR-HARQ transmission and each of a plurality of IR-HARQ retransmissions, over a channel by performing, for each bit input to the inner encoder from one of the polar sub-encoders for the HARQ transmission, an Exclusive Or (XOR) operation with a corresponding bit output by a previous polar sub-encoder that was used to perform encoding of a previous in time IR-HARQ transmission or retransmission.

11. A method of encoding data for incremental redundancy for hybrid ARQ (HARQ) transmissions in a wireless network, the method comprising:

encoding, by an outer encoder, a set of information bits;

performing, by each polar sub-encoder of a set of polar sub-encoders, polar encoding of bits received from the outer encoder for a corresponding incremental redundancy (IR) hybrid ARQ (HARQ) transmission;

performing, by an inner encoder, for each bit input to the inner encoder from one of the polar sub-encoders for the IR-HARQ transmission, an Exclusive Or (XOR) operation with another bit, to generate a set of code bits for an IR-HARQ transmission over a channel, where the code bits are outputted by a plurality of polar sub-encoders of the set of polar sub-encoders, and each of the polar sub-encoders is associated with an IR-HARQ transmission, an IR-HARQ retransmission, a plurality of IR-HARQ transmissions, or a plurality of IR-HARQ retransmissions;

applying, by the inner encoder, at least one frozen bit to the set of polar sub-encoders for an initial transmission of the IR-HARQ transmission;

applying, by the inner encoder, at least two frozen bits to the set of polar sub-encoders for a first retransmission of the IR-HARQ transmission; and applying, by the inner encoder, at least three frozen bits to the set of polar sub-encoders for a second retransmission of the IR-HARQ transmission.

12. An apparatus comprising at least one processor and at least one memory including computer instructions that, when executed by the at least one processor, cause the apparatus to perform a method comprising:

encoding, by an outer encoder, a set of information bits;

performing, by each polar sub-encoder of a set of polar sub-encoders, polar encoding of bits received from the outer encoder for a corresponding incremental redundancy (IR) hybrid ARQ (HARQ) transmission;

performing, by an inner encoder, for each bit input to the inner encoder from one of the polar sub-encoders for the IR-HARQ transmission, an Exclusive Or (XOR) operation with another bit, to generate a set of code bits for an IR-HARQ transmission over a channel, where the code bits are outputted by a plurality of polar sub-encoders of the set of polar sub-encoders, and each of the polar sub-encoders is associated with an IR-HARQ transmission, an IR-HARQ retransmission, a plurality of IR-HARQ transmissions, or a plurality of IR-HARQ retransmissions;

applying, by the inner encoder, at least one frozen bit to the set of polar sub-encoders for an initial transmission of the IR-HARQ transmission;

applying, by the inner encoder, at least two frozen bits to the set of polar sub-encoders for a first retransmission of the IR-HARQ transmission; and applying, by the inner encoder, at least three frozen bits to the set of polar sub-encoders for a second retransmission of the IR-HARQ transmission.

13. The apparatus of claim 12, wherein the method that the computer instructions cause the apparatus to perform further comprises:

performing, by the inner encoder, an XOR operation between code bits of a first retransmission and an initial transmission; and perform, by the inner encoder, an XOR operation between code bits of a second retransmission and the first retransmission.

14. The apparatus of claim 12, wherein the instructions are further configured to cause the apparatus to:

perform, by the inner encoder, an XOR operation between code bits of a first retransmission and an initial transmission; and perform, by the inner encoder, an XOR operation between code bits of a second retransmission and the first retransmission.

15. The apparatus of claim 12, wherein the inner encoder, coupled to outputs of the set of polar sub-encoders, is further configured to:

apply, by the inner encoder, a first set of one or more frozen bits to the set of polar sub-encoders for an initial transmission of the IR-HARQ transmission;

apply, by the inner encoder, a second set of one or more frozen bits to the set of polar sub-encoders for a first retransmission of the IR-HARQ transmission; and apply, by the inner encoder, a third set of one or more frozen bits to the set of polar sub-encoders for a second retransmission of the IR-HARQ transmission.

* * * * *

UNITED STATES PATENT AND TRADEMARK OFFICE
CERTIFICATE OF CORRECTION

| | |
|---|---|
| PATENT NO. | : 11,184,117 B2 |
| APPLICATION NO. | : 16/346542 |
| DATED | : November 23, 2021 |
| INVENTOR(S) | : Chen et al. |

It is certified that error appears in the above-identified patent and that said Letters Patent is hereby corrected as shown below:

In the Claims

In Column 15, Line 39, Claim 11, delete "fora" and insert -- for a --, therefor.

Signed and Sealed this
Second Day of August, 2022

Katherine Kelly Vidal
*Director of the United States Patent and Trademark Office*